(12) United States Patent
Tsuchiya

(10) Patent No.: US 8,516,419 B2
(45) Date of Patent: Aug. 20, 2013

(54) VERIFICATION DEVICE OF SEMICONDUCTOR INTEGRATED CIRCUIT, VERIFICATION METHOD OF SEMICONDUCTOR INTEGRATED CIRCUIT, AND COMPUTER READABLE MEDIUM STORING VERIFICATION PROGRAM OF SEMICONDUCTOR INTEGRATED CIRCUIT

(76) Inventor: Takehiko Tsuchiya, Yokohama (JP)

(*) Notice: Subject to any disclaimer, the term of this patent is extended or adjusted under 35 U.S.C. 154(b) by 490 days.

(21) Appl. No.: 12/405,400

(22) Filed: Mar. 17, 2009

(65) Prior Publication Data

US 2009/0293026 A1 Nov. 26, 2009

(30) Foreign Application Priority Data

May 23, 2008 (JP) ................................. 2008-135717

(51) Int. Cl.
*G06F 9/455* (2006.01)
*G06F 17/50* (2006.01)

(52) U.S. Cl.
USPC ........................................ 716/106; 716/107

(58) Field of Classification Search
USPC ................................. 716/106, 107
See application file for complete search history.

(56) References Cited

U.S. PATENT DOCUMENTS

| 7,107,569 | B2 | 9/2006 | Ito |
| 7,194,713 | B2 | 3/2007 | Iwashita |
| 7,882,483 | B2* | 2/2011 | Gangadharan et al. ........ 716/106 |
| 2006/0036983 | A1* | 2/2006 | Iwashita ............................. 716/5 |
| 2008/0222205 | A1* | 9/2008 | Lange .......................... 707/104.1 |
| 2009/0064059 | A1 | 3/2009 | Tsuchiya |

FOREIGN PATENT DOCUMENTS

JP 2006-053813 2/2006

* cited by examiner

*Primary Examiner* — Jack Chiang
*Assistant Examiner* — Eric Lee
(74) *Attorney, Agent, or Firm* — White & Case LLP

(57) ABSTRACT

According to one embodiment, a verification device of semiconductor integrated circuit includes an assertion based verification unit, a logic generating unit, a signal restriction generating unit, and an estimation unit. The assertion based verification unit performs assertion based verification of the circuit description based on the assertion description, and generates pass information when the operation of the signal described in the assertion description conforming to a preliminary condition is observed in the circuit description, or generates failure information when the operation of the signal is not observed in the circuit description. The logic generating unit extracts a signal corresponding to the failure information from the assertion description, and generates an input/output logic of the circuit description from the extracted signal. The signal restriction generating unit generates a signal restriction based on the input/output logic. The estimating unit evaluates the validity of the signal restriction.

16 Claims, 7 Drawing Sheets

```
1  assign GEN_ACK  =(c_state == 3'b000)? s_start:1'b0;
2  assign APS_ACK  =(c_state == 3'b001)? s_start:1'b0;
3  assign MISC_ACK =(c_state == 3'b010)? s_start:1'b0;
4  assign s_start=START;
5  always@(req_gen_r or req_asp_r or req_acr_r)
6       if      (r_gen_r  )c_state = 3'b000;
7       else if(r_asp_r  )c_state = 3'b001;
8       else if(r_misc_r )c_state = 3'b010;
9       else              c_state = 3'b000;
10
11 always@(posedge CLK or negedge RST_X)
12      if(!RST_X)r_gen_r <= 1'b0;
13      else            r_gen_r <= GEN_REQ;
14 always@(posedge CLK or negedge RST_X)
15      if(!RST_X)r_asp_r <= 1'b0;
16      else            r_asp_r <= ASP_REQ;
17
18 always@(posedge CLK or negedge RST_X)
19      if(!RST_X)r_misc_r <= 1'b0;
20      else            r_misc_r <= MISC_REQ;
```
~101A

FIG. 2

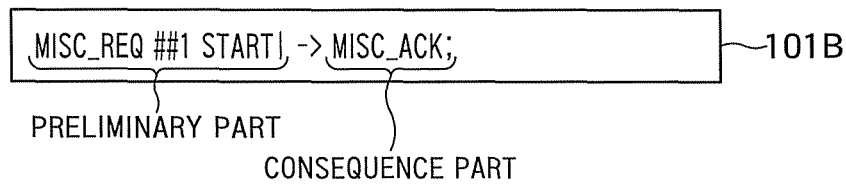

FIG. 3

(a)
```
not(
    (GEN_REQ && ASP_REQ && MISC_REQ)
 || (GEN_REQ && !ASP_REQ && MISC_REQ)
 || (!GEN_REQ && ASP_REQ && MISC_REQ)
   );
```
~ $104A_1$ (b)
```
not(
    (GEN_REQ && ASP_REQ && MISC_REQ)
 || (GEN_REQ && !ASP_REQ && MISC_REQ)
 || (GEN_REQ && ASP_REQ && !MISC_REQ)
   );
```
~ $104A_2$ (c)
```
not(
    (GEN_REQ && ASP_REQ && MISC_REQ)
 || (GEN_REQ && ASP_REQ && !MISC_REQ)
 || (!GEN_REQ && ASP_REQ && MISC_REQ)
   );
```
~ $104A_3$ (d)
```
not(
    (GEN_REQ && ASP_REQ && MISC_REQ)
 || (GEN_REQ && !ASP_REQ && MISC_REQ)
 || (!GEN_REQ && ASP_REQ && MIS_REQ)
 || (GEN_REQ && ASP_REQ && !MISC_REQ)
 || (REN_REQ && ASP_REQ && !MISC_REQ)
   );
```
~ $104A_4$ (e)
```
(
    (!GEN_REQ && !ASP_REQ && MISC_REQ)
 || (!GEN_REQ && ASP_REQ && !MISC_REQ)
 || (GEN_REQ && !ASP_REQ && !MISC_REQ)
 || (!GEN_REQ && !ASP_REQ && !MISC_REQ)
);
```
~ $104A_5$ (f)
```
$onehot0 (GEN_REQ,ASP_REQ,MISC_REQ);
```
~ $104A_6$

FIG. 12

VERIFICATION DEVICE OF SEMICONDUCTOR INTEGRATED CIRCUIT, VERIFICATION METHOD OF SEMICONDUCTOR INTEGRATED CIRCUIT, AND COMPUTER READABLE MEDIUM STORING VERIFICATION PROGRAM OF SEMICONDUCTOR INTEGRATED CIRCUIT

CROSS-REFERENCE TO RELATED APPLICATION

This application is based upon and claims the benefit of priority from the prior Japanese Patent Applications No. 2008-135717, filed on May 23, 2008; the entire contents of which are incorporated herein by reference.

BACKGROUND OF THE INVENTION

1. Field of the Invention

The present invention relates to a verification device for verifying whether a semiconductor integrated circuit operates normally or not, a verification method of the semiconductor integrated circuit, and computer readable medium storing verification program of the semiconductor integrated circuit. More particularly, the present invention relates to a verification device of semiconductor integrated circuit for executing assertion based verification, a verification method of the same, and a computer readable medium storing a verification program of the same.

2. Background Art

Recently, various verification devices of semiconductor integrated circuit are known, including, for example, a verification device of semiconductor integrated circuit for verifying by using verification language description such as assertion description (see Japanese Patent Application Laid-Open No. 2006-53813).

In this verification device, possible causes of failure in verification result include description error in circuit description, description error in verification language description, abnormal action due to combination of input signals prohibited in the specification, and shortage of preliminary condition in verification language description.

In a general verification device, an arbitrary one type of waveform is issued as failure information out of the circuit transition state causing failure. The verification inspector repeats trial and error for identifying the cause of failure from the four causes mentioned above on the basis of this failure information. It hence takes a tremendous time in verification of semiconductor integrated circuit.

In particular, in the case of a formal tool, since verification is required to cover all combinations of input signals by using a mathematical technique, lots of failure information occur due to abnormal action and shortage of preliminary conditions. Although such failure information is actually a meaningless information (hereinafter, referred to as "false error"), the verification inspector must eliminate all these false errors. For example, if the specification defines, "six signals of request system are one hot (permissible if all are 0)," in the event of six types of 1-bit request, 57 patterns out of 64 patterns (26 signals), that is, failure information of combination of 89% of signals is false error. It is extremely inefficient for the verification inspector to conduct trial and error in such event.

BRIEF SUMMARY OF THE INVENTION

According to a first aspect of the invention, there is provided that a verification device of semiconductor integrated circuit configured to verify the equivalence of circuit description and assertion description, comprising:

an assertion based verification unit configured to perform assertion based verification of the circuit description on the basis of the assertion description, and generating pass information when the operation of the signal described in the assertion description conforming to a preliminary condition is observed in the circuit description, or generating failure information when the operation of the signal is not observed in the circuit description, a logic generating unit configured to extract a signal corresponding to the failure information from the assertion description, and generating an input/output logic of the circuit description from the extracted signal, a signal restriction generating unit configured to generate a signal restriction on the basis of the input/output logic generated by the logic generating unit, and an estimating unit configured to evaluate the validity of the signal restriction generated by the signal restriction generating unit.

According to a second aspect of the invention, there is provided that a verification method of semiconductor integrated circuit configured to verify the equivalence of circuit description and assertion description, comprising:

performing assertion based verification of the circuit description on the basis of the assertion description generating pass information when the operation of the signal described in the assertion description conforming to a preliminary condition is observed in the circuit description, or generating failure information when the operation of the signal is not observed in the circuit description, extracting a signal corresponding to the failure information from the assertion description generating an input/output logic of the circuit description from the extracted signal, generating a signal restriction on the basis of the input/output logic, and evaluating the validity of the signal restriction.

According to a third aspect of the invention, there is provided that a computer readable medium storing verification program of semiconductor integrated circuit configured to verify the equivalence of circuit description and assertion description, the program comprising:

an assertion based verification instruction configured to perform assertion based verification of the circuit description on the basis of the assertion description, and generating pass information when the operation of the signal described in the assertion description conforming to a preliminary condition is observed in the circuit description, or generating failure information when the operation of the signal is not observed in the circuit description, a logic generating instruction configured to extract a signal corresponding to the failure information from the assertion description, and generating an input/output logic of the circuit description from the extracted signal, a signal restriction generating instruction configured to generate a signal restriction on the basis of the input/output logic generated by the logic generating instruction, and an estimating instruction configured to evaluate the validity of the signal restriction generated by the signal restriction generating instruction.

BRIEF DESCRIPTION OF THE DRAWINGS

FIG. 2 is a schematic diagram of one example of a circuit description 101A.

FIG. 3 is a schematic diagram of one example of an assertion description 101B.

FIG. 12(a) to (f) are schematic diagrams of one example of a signal restriction 104A generated in the optimization process shown in FIG. 11.

DETAILED DESCRIPTION OF THE INVENTION

Embodiments of the invention will be described below while referring to the accompanying drawings. The following embodiments are merely examples of the invention, and are not intended to limit the scope of the invention.
[Embodiment 1]

Embodiment 1 of the invention is explained below. Embodiment 1 of the invention is an example of verification device of semiconductor integrated circuit for issuing a signal restriction and an assertion description modified for suppressing failures.

Figure 1:
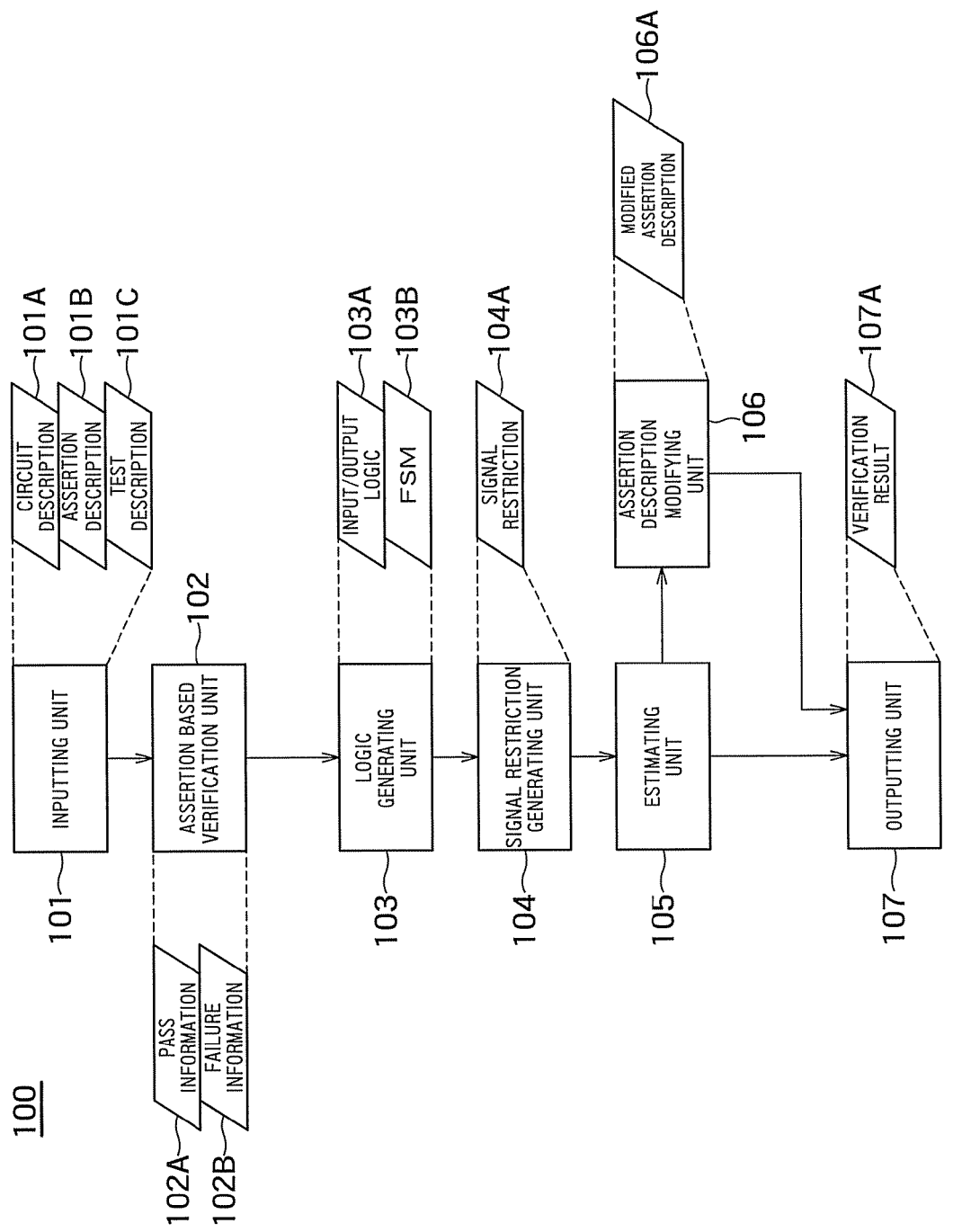
FIG. 1 is a block diagram of verification device 100 of semiconductor integrated circuit according to embodiment 1 of the invention.

FIG. 1 is a block diagram of verification device 100 of semiconductor integrated circuit according to embodiment 1 of the invention.

This verification device 100 includes an inputting unit 101, an assertion based verification unit 102, a logic generating unit 103, a signal restriction generating unit 104, an estimating unit 105, an assertion description modifying unit 106, and an outputting unit 107.

The inputting unit 101 inputs a circuit description 101A, an assertion description 101B, and a test description 101C. The inputting unit 101 is, for example, an interface of an input device such as keyboard or mouse to be connected to the verification device 100. The circuit description 101A is a register transfer level description (hereinafter referred to as "RTL description") as shown, for example, in FIG. 2. In FIG. 2, Lines 1 to 4 mean a module for generating ACK signal, Lines 5 to 9 mean a state machine (hereinafter referred to as "FSM (Finit State Machine)") 103B, and Lines 11 to 20 mean a module for receiving REQ signal. The assertion description 101B includes the design specification, preliminary part including preliminary condition in an implication operation, and consequence part. In FIG. 3, the preliminary part means that when signal "MISC_REQ" is 1, signal "START" is 1 after 1 cycle. In FIG. 3, the consequence part means that signal "MISC_ACK" is 1 in the same cycle. The test description 101C is, for example, test vector or simulation pattern.

Figure 4:
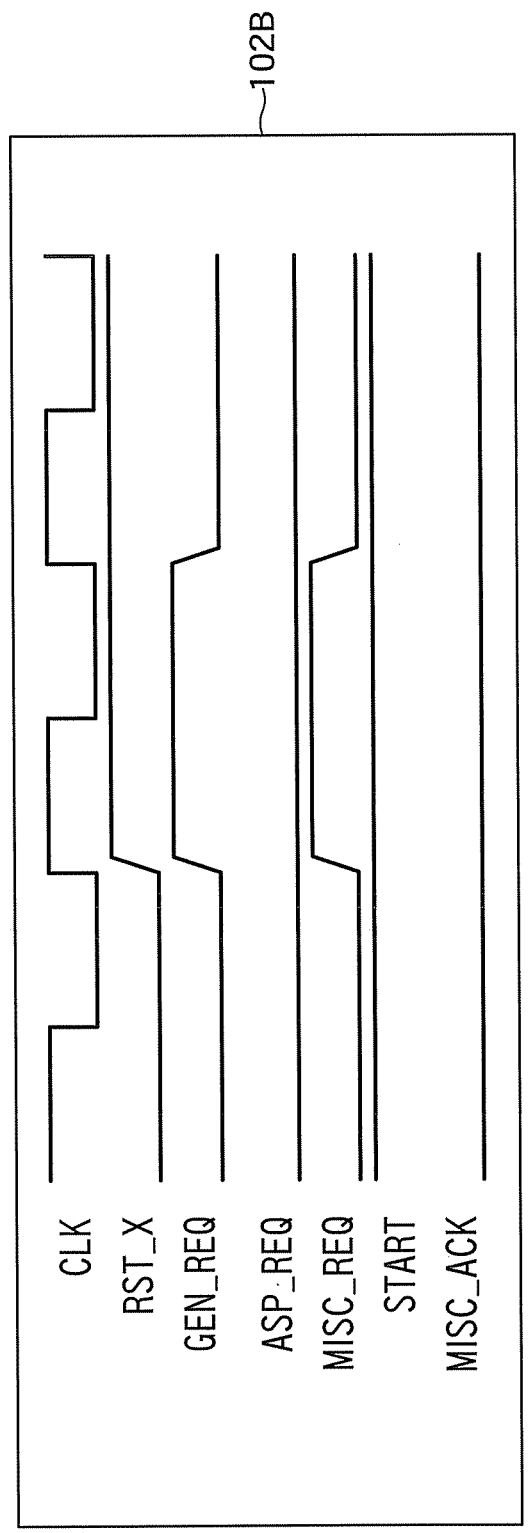
FIG. 4 is a schematic diagram of one example of failure information 102B.

The assertion based verification unit 102 determines whether preliminary condition of the assertion description 101B in relation to the circuit description 101A establishes or not (that is, pass or failure) using the formal verification technology or simulation technology. The assertion based verification unit 102 determines "pass" and generates pass information 102A when the signal operation described in the assertion description 101B conforming to the preliminary condition is strictly observed in the circuit description 101A during the execution of assertion based verification (that is, failure is not occurring). On the other hands, the assertion based verification unit 102 determines "failure" and generates failure information 102B when the signal operation described in the assertion description 101B is not observed in the circuit description 101A during the execution of assertion based verification (that is, failure is occurring). For example, in the case of the formal verification technology, the pass information 102A includes a flag showing that failure is not occurring. In the case of the simulation technology, the pass information 102A includes the number of times of pass, time when the assertion starts, and time when pass occurs. For example, in the case of the formal verification technology, the failure information 102B includes the waveform information recording the circuit transition state up to occurrence of failure in the circuit description 101A (see FIG. 4). In the case of the simulation technology, the failure information 102B includes the number of failure, time when the assertion starts, and time when failure occurs. In the case of the simulation technology, the assertion based verification unit 102 makes use of the test description 101C.

Figure 5:
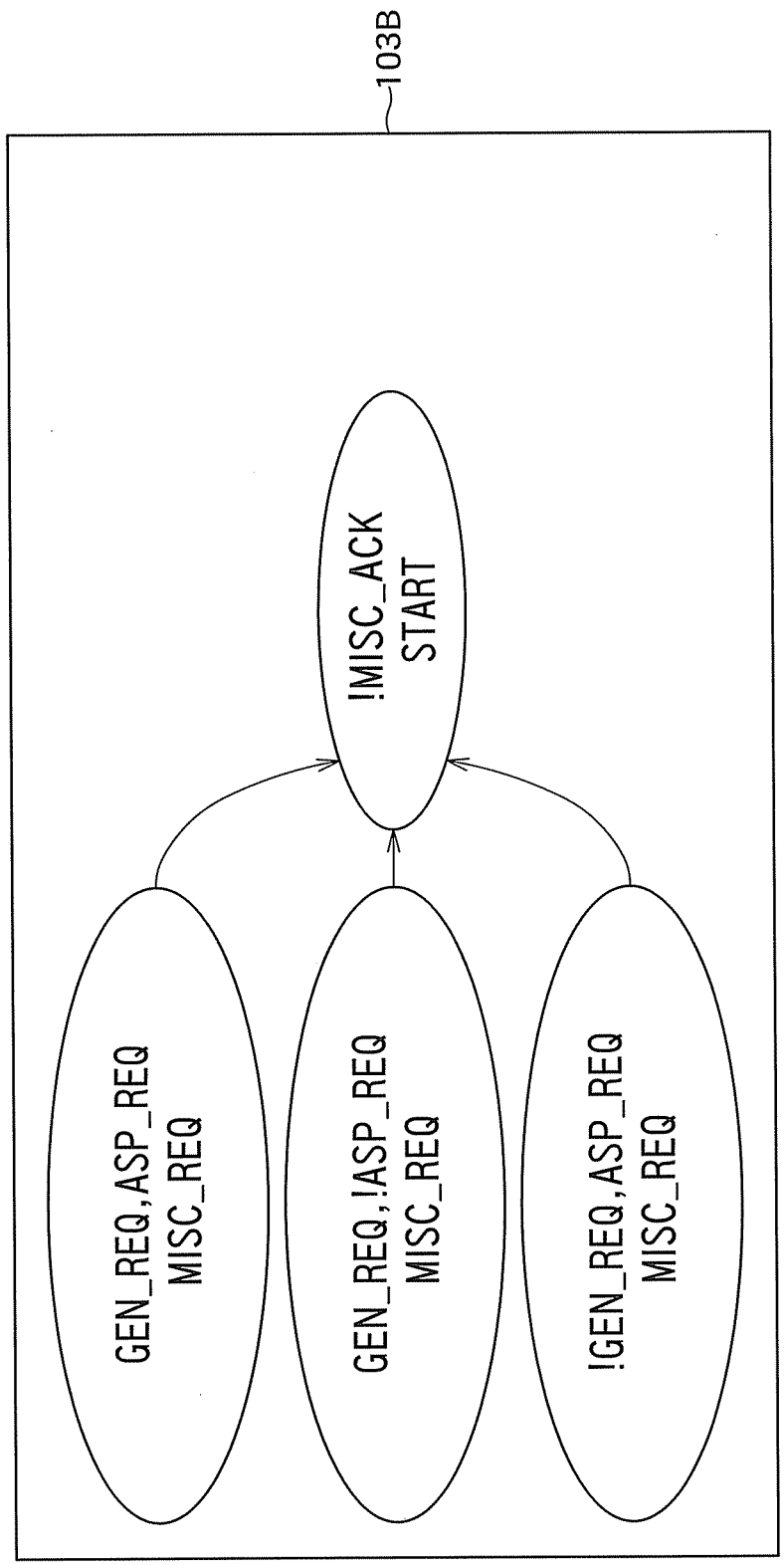
FIG. 5 is a schematic diagram of one example of FSM 103B corresponding to FIG. 3 and FIG. 4.
Figure 6:
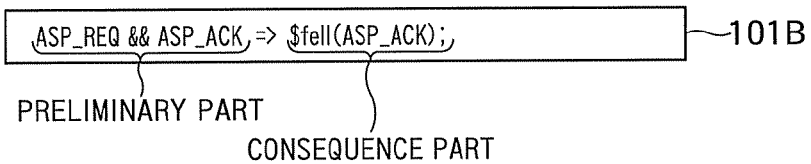
FIG. 6 is a schematic diagram of one example of an assertion description 101B.
Figure 7:
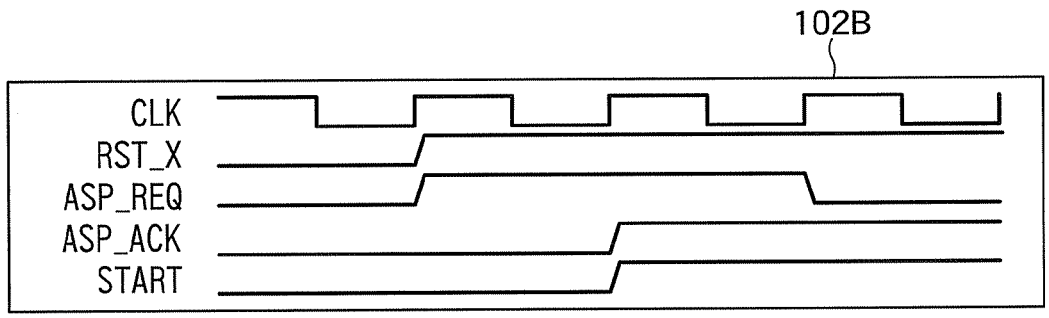
FIG. 7 is a schematic diagram of one example of failure information 102B.

The logic generating unit 103 extracts a signal corresponding to the failure information 102B from the assertion description 101B when the failure information 102B is generated by the assertion based verification unit 102, and generates input/output logic 103A of the circuit description 101A corresponding to the extracted signal. At this time, the logic generating unit 103 deletes the state in which signal values other than the defined values are used, as for the signals defined as the preliminary condition in the assertion description 101B. The logic generating unit 103 also extracts a signal corresponding to the failure information 102B, and generates a state machine FSM 103B as shown in FIG. 5, on the basis of the input/output logic 103A of circuit description 101A corresponding to the signal. At this time, the logic generating unit 103 deletes the intermediate variable, and generates the FSM 103B including only the input signal corresponding to the circuit description 101A and the signal described in the assertion description 101B. The logic generating unit 103 generates the FSM 103B as shown in FIG. 8 when the assertion based verification unit 102 generates failure information 102B as shown in FIG. 7 to the assertion description 101B as shown in FIG. 6.

Figure 8:
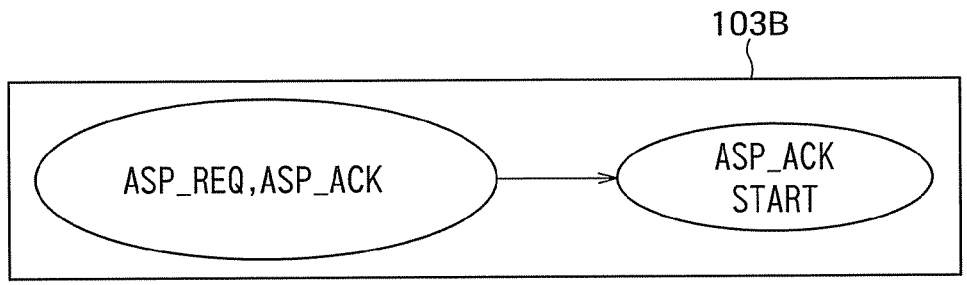
FIG. 8 is a schematic diagram of one example of FSM 103B corresponding to FIG. 6 and FIG. 7.
Figure 9:
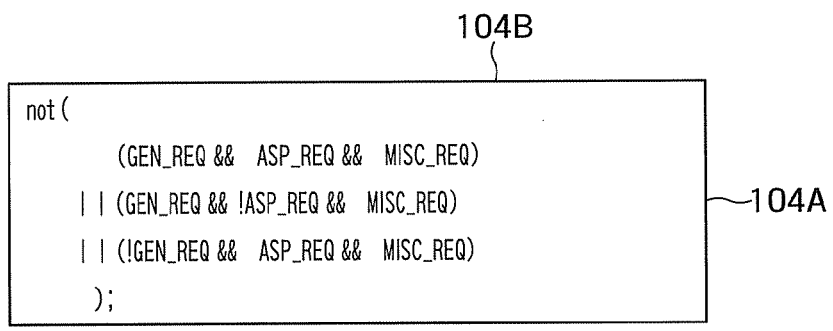
FIG. 9 is a schematic diagram of one example of a signal restriction 104A corresponding to FIG. 5.
Figure 10:
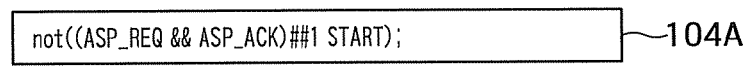
FIG. 10 is a schematic diagram of one example of a signal restriction 104A corresponding to FIG. 8.

The signal restriction generating unit 104 extracts a combination of signals in the process up to occurrence of failure in the circuit description 101A, on the basis of the input/output logic 103A generated by the logic generating unit 103, or the FSM 103B as shown in FIG. 5 or FIG. 8, and generates a signal restriction 104A, including a combination of signals which is not defined in the specification of the circuit, on the basis of the extracted combination. The signal restriction generating unit 104 generates the signal restriction 104A as shown in FIG. 9 as the signal restriction 104A to the FSM 103B as shown in FIG. 5, and generates the signal restriction 104A expressing the time transition as shown in FIG. 10 as the signal restriction 104A corresponding to the FSM 103B as shown in FIG. 8. FIG. 9 shows the signal restriction 104A expressing that one signal "MISC_REQ" and the other two signals "MISC REQ" are value of "1" at the same time. The signal restriction generating unit 104 may also generates the signal restriction 104A on the basis of the FSM 103B preliminarily inputted by the inputting unit 101. The signal restriction generating unit 104 may also generate a plurality of signal restrictions 104A corresponding to the plurality of FSMs 103B.

The estimating unit 105 evaluates the validity of the signal restriction 104A generated by the signal restriction generating unit 104. At this time, the estimating unit 105, when the signal restriction 104A is applied, estimates the signal restriction 104A "invalid" when the assertion description 101B not satisfying the preliminary condition is present or the arbitrary signal described in the assertion description 101B is a fixed value. For example, the signal restriction 104A stating "START==0" is estimated "invalid" because it is a restriction of specifying the arbitrary signal to be a fixed value. The signal restriction 104A stating "$onehot (GEN_REQ, ASP_REQ, MISC_REQ;" is estimated to be "invalid" because the state of "!GEN_REQ&&!ASP_REQ&&!MISC_REQ" is not established in the presence of description "!GEN_REQ&&!ASP_REQ&&MISC_REQ|=>!GEN_ACK&&!ASP_ACK&&!MISC_ACK" in the assertion description 101B.

Processing of the logic generating unit 103, the signal restriction generating unit 104, and the estimating unit 105 is executed in every assertion description 101B having a failure. After the estimating result is defined, similar processing is executed on other assertion-based description 101B having a failure.

The assertion description modifying unit 106 modifies the assertion description 101B corresponding to the signal restriction 104A when the signal restriction 104A is estimated to be "invalid" by the estimating unit 105, and generates a modified assertion description 106A. When the signal restriction 104A is applied, the assertion description modifying unit 106 adds the signal restriction 104 estimated to be "invalid" to the preliminary condition of the assertion description 101B so that the preliminary condition of the assertion description 101B is established, or the arbitrary signal described in the assertion description 101B is a variable value, and thereby generates the modified assertion description 106A. The assertion description modifying unit 106 may also generated the modified assertion description 106A by changing the time definition of the input signal so as to suppress the failure by using the FSM 103B generated by the logic generating unit 103 to the input signal described in the assertion description 101B.

The outputting unit 107, when the signal restriction 104A estimated to be "valid" by the estimating unit 105 is present, issues this signal restriction 104A as a verification result 107A. The outputting unit 107, when the signal restriction 104A estimated to be "invalid" by the estimating unit 105 is present, issues the modified assertion description 106A generated by the assertion description modifying unit 106 as a verification result 107A. The outputting unit 107, if the signal restriction generating unit 104 cannot generate the signal restriction 104A capable of suppressing the failure, or if there is signal restriction 104A estimated to be "invalid" by the estimating unit 105 and the assertion description modifying unit 106 cannot generate modified assertion description 106A, issues the failure information 102B including one type of waveform arbitrarily selected from the circuit transition state causing the failure as a verification result 107A. The outputting unit 107 is, for example, an interface of display device to be connected to the verification device 100.

According to embodiment 1 of the invention, in the assertion based verification, a signal restriction necessary for suppressing abnormal state of circuit or false error due to combination of input signals prohibited in the specification in the event of a failure is generated, and thereby the verification efficiency of semiconductor integrated circuit can be enhanced.

Also, according to embodiment 1 of the invention, if signal restriction 104A cannot be generated, on the basis of the desired assertion description 101B, the assertion description 101B is modified so that the failure may be suppressed, and thereby trial and error can be omitted. As a result, the working time required for verification of semiconductor integrated circuit can be shortened.

According to embodiment 1 of the invention, since the assertion description modifying unit 106 modifies only the input signal, and excessive generation of modified assertion description 106A can be prevented. As a result, the verification efficiency of semiconductor integrated circuit of a large scale can be enhanced.

According to embodiment 1 of the invention, since the estimating unit 105 evaluates the validity of the signal restriction 104A, skipping of verification due to excessive restriction included in the signal restriction 104A can be prevented. As a result, the verification quality of the semiconductor integrated circuit can be enhanced.

[Embodiment 2]

Embodiment 2 of the invention will be described. Embodiment 2 of the invention is an example of optimizing when the signal restriction generating unit 104 generates a plurality of signal restrictions 104A from a plurality of FSMs 103B. Explanation of same content as in embodiment 1 of the invention is omitted.

Figure 11:
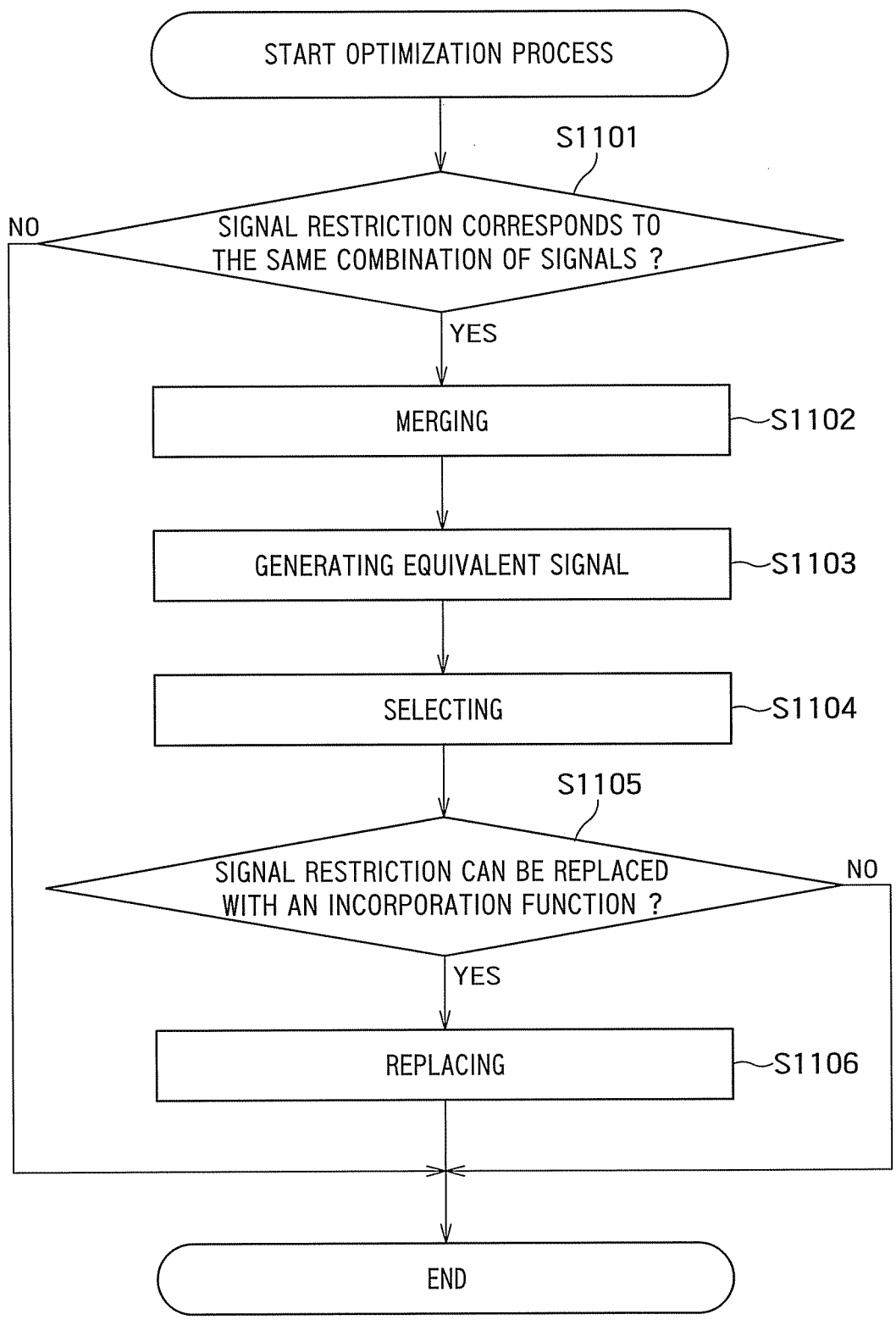
FIG. 11 is a flowchart showing the processing procedure of optimization process of the signal restriction generating unit 104 according to the embodiment 2 of the invention.

FIG. 11 is a flowchart showing the processing procedure of optimization process of the signal restriction generating unit 104 according to the embodiment 2 of the invention.

First, as shown in FIG. 12A to 12C, if the plurality of signal restrictions $104A_1$ to $A_3$ generated from the plurality of FSMs 103B correspond to the same combination of signals (S1101—YES), the signal restriction generating unit 104 merges the plurality of combinations of signals (S1102). In this case, if the plurality of signal restrictions $104A_1$ to $A_3$ correspond to the same combination of signals, the signal restriction generating unit 104 merges the combinations by logic sum calculation, and deletes duplicate terms. As a result, a signal restriction $104A_4$ as shown in FIG. 12D is generated.

Next, as shown in FIG. 12E, the signal restriction generating unit 104 calculates the logic sum of combination of signals to be generated, aside from the logic sum calculation of combination of signals not to be generated in the present logic negation, and generates a signal restriction $104A_5$ equivalent to the signal restriction $104A_4$ generated at S1102 (S1103).

Further, the signal restriction generating unit 104 compares the number of terms between the signal restriction $104A_4$ generated at S1102 and the signal restriction $104A_5$ generated at S1103, and selects the signal restriction 104A corresponding to the combination of the smallest number of terms (S1104). Herein, the signal restriction $104A_5$ is selected because the number of terms is smaller than in the signal restriction $104A_4$.

When the signal restriction $104A_5$ selected at S1104 can be replaced with an incorporation function (S1105—YES), the signal restriction generating unit 104 replaces the signal restriction $104A_5$ selected at S1104 with the incorporation function (S1106), and completes this optimization process. For example, the signal restriction generating unit 104 determines if pattern matching can be replaced or not with the incorporation function "$onehot0" or the like of "IEEE1800-2005 SystemVerilog", and replaces if replacement is possible. As a result, a signal restriction $105A_6$ as shown in FIG. 12F is generated.

If the signal restriction 104A₅ selected at S1104 cannot be replaced with the incorporation function (S1105—NO), the signal restriction generating unit 104 completes this optimization process without replacing with incorporation function.

This optimization process is not executed for signal restriction 104A corresponding to the different combination of signals (S1101—NO).

According to embodiment 2 of the invention, the signal restriction generating unit 104 processes the optimization so as to decrease the number of logic terms of the signal restriction 104A, and the signal restriction 104A can be issued so as to be recognized easily by the user.

At least part of the verification device explained in the embodiments may be composed of hardware or software. When composed of software, a program for realizing the function of at least part of the verification device may be stored in a recording medium such as flexible disk or CD-ROM, and may be read into a computer and executed. The recording medium is not only a portable one such as magnetic disk or optical disk, but also a fixed recording medium such as hard disk drive or memory.

The program for realizing the function of at least part of the verification device may be distributed by the Internet or other communication circuit (including wireless communication). Also, the program can be distributed by means of a fixed and wireless circuit such as the Internet or a recording medium in an encrypted state or a modulated or compressed state.

What is claimed is:

1. A device configured to verify equivalence between circuit description and assertion description, the device comprising:
    an assertion based verification unit configured to perform assertion based verification of the circuit description on the basis of the assertion description, and generate pass information or failure information, the pass information being generated when operation of a signal described in the assertion description in which a preliminary condition is satisfied is observed in the circuit description, the failure information being generated when the operation of the signal is not observed in the circuit description;
    a logic generating unit configured to extract a signal corresponding to the failure information from the assertion description and generate an input/output logic of the circuit description from the extracted signal;
    a signal restriction generating unit configured to generate a signal restriction on the basis of the input/output logic;
    an evaluating unit configured to evaluate validity of the signal restriction;
    an assertion description modifying unit configured to modify the assertion description when the validity indicates invalid; and
    an outputting unit configured to output the signal restriction when the validity indicates valid and output the modified assertion description when the validity indicates invalid, wherein the outputting unit outputs failure information comprising a waveform selected from a circuit transition state when the signal restriction cannot be generated and the assertion description cannot be modified.

2. The device of claim 1, wherein when the signal restriction is applied, the evaluating unit evaluates the signal restriction invalid if the assertion description not satisfying the preliminary condition is present or if the signal described in the assertion description is a fixed value.

3. The device of claim 1, wherein the assertion description modifying unit modifies the assertion description in such a manner that the preliminary condition of the assertion description is satisfied when the signal restriction is applied.

4. The device of claim 1, wherein the assertion description modifying unit modifies the assertion description in such a manner that the signal described in the assertion description is a variable value.

5. The device of claim 1, wherein the logic generating unit generates a state machine on the basis of the input/output logic.

6. The device of claim 1, wherein the signal restriction generating unit generates a signal restriction expressing the time transition.

7. The device of claim 1, wherein the signal restriction generating unit merges a combination of a plurality of signals and generates the combination having the smallest number of terms as the signal restriction.

8. The device of claim 7, wherein the signal restriction generating unit further generates an equivalent signal restriction equivalent to the signal restriction, compares the number of terms in the signal restriction with the number of terms in the equivalent signal restriction, and generates the combination having the smallest number of terms as the signal restriction.

9. The device of claim 7, wherein the signal restriction generating unit replaces the signal restriction with an incorporation function.

10. A method to verify equivalence between circuit description and assertion description, the method comprising:
    employing a computer to execute computer executable instructions stored in a memory to perform the following acts:
        performing assertion based verification of the circuit description on the basis of the assertion description;
        generating pass information or failure information, the pass information being generated when operation of a signal described in the assertion description in which a preliminary condition is satisfied is observed in the circuit description, the failure information being generated when the operation of the signal is not observed in the circuit description;
        extracting a signal corresponding to the failure information from the assertion description;
        generating an input/output logic of the circuit description from the extracted signal;
        generating a signal restriction on the basis of the input/output logic;
        evaluating validity of the signal restriction;
        modifying the assertion description when the validity indicates invalid;
        outputting the signal restriction when the validity indicates valid;
        outputting the modified assertion description when the validity indicates invalid; and
        outputting failure information comprising a waveform selected from a circuit transition state when the signal restriction cannot be generated and the assertion description cannot be modified.

11. The method of claim 10, wherein in evaluating the validity, when the signal restriction is applied, it is evaluated that the signal restriction is invalid if the assertion description not satisfying the preliminary condition is present or if the signal described in the assertion description is a fixed value.

12. The method of claim 10, wherein in modifying the assertion description, the assertion description is modified in such a manner that the preliminary condition of the assertion description is satisfied when the signal restriction is applied.

13. The method of claim 10, in modifying the assertion description, the assertion description is modified in such a manner that the signal described in the assertion description is a variable value.

14. The method of claim 10, wherein in generating the signal restriction, a state machine on the basis of the input/output logic is generated.

15. The method of claim 10, wherein in generating the signal restriction, a signal restriction expressing the time transition is generated.

16. A non-transitory computer readable medium storing a computer program code configured to verify the equivalence between circuit description and assertion description, the computer program code comprising:

performing assertion based verification of the circuit description on the basis of the assertion description;

generating pass information or failure information, the pass information being generated when operation of a signal described in the assertion description in which a preliminary condition is satisfied is observed in the circuit description, the failure information being generated when the operation of the signal is not observed in the circuit description;

extracting a signal corresponding to the failure information from the assertion description;

generating an input/output logic of the circuit description from the extracted signal;

generating a signal restriction on the basis of the input/output logic;

evaluating validity of the signal restriction;

modifying the assertion description when the validity indicates invalid;

outputting the signal restriction when the validity indicates valid;

outputting the modified assertion description when the validity indicates invalid; and outputting failure information comprising a waveform selected from a circuit transition state when the signal restriction cannot be generated and the assertion description cannot be modified.

* * * * *